(12) United States Patent
Simon et al.

(10) Patent No.: US 7,878,791 B2
(45) Date of Patent: *Feb. 1, 2011

(54) IMPRINT LITHOGRAPHY

(75) Inventors: Klaus Simon, Eindhoven (NL); Karel Diederick Van Der Mast, Helmond (NL); Johan Frederik Dijksman, Weert (NL)

(73) Assignee: ASML Netherlands B.V., Veldhoven (NL)

( * ) Notice: Subject to any disclaimer, the term of this patent is extended or adjusted under 35 U.S.C. 154(b) by 903 days.

This patent is subject to a terminal disclaimer.

(21) Appl. No.: 11/364,490

(22) Filed: Mar. 1, 2006

(65) Prior Publication Data

US 2007/0102844 A1    May 10, 2007

Related U.S. Application Data

(60) Provisional application No. 60/733,175, filed on Nov. 4, 2005.

(51) Int. Cl.
*B29C 59/02* (2006.01)
*G03B 27/58* (2006.01)

(52) U.S. Cl. .......................... 425/345; 355/72; 355/78; 425/375; 425/385

(58) Field of Classification Search ............... 425/385, 425/345, 375; 355/72, 78
See application file for complete search history.

(56) References Cited

U.S. PATENT DOCUMENTS

| | | | |
|---|---|---|---|
| 5,512,131 A | 4/1996 | Kumar et al. | 156/655.1 |
| 5,772,905 A | 6/1998 | Chou | 216/44 |
| 6,165,911 A | 12/2000 | Calveley | 438/754 |
| 6,208,407 B1 | 3/2001 | Loopstra | |
| 6,309,580 B1 | 10/2001 | Chou | 264/338 |
| 6,334,960 B1 | 1/2002 | Willson et al. | 216/52 |
| 6,365,059 B1 | 4/2002 | Pechenik | 216/52 |
| 6,375,870 B1 | 4/2002 | Visovsky et al. | 264/1.31 |
| 6,482,742 B1 | 11/2002 | Chou | 438/690 |
| 6,517,995 B1 * | 2/2003 | Jacobson et al. | 430/320 |
| 6,518,189 B1 | 2/2003 | Chou | 438/706 |

(Continued)

FOREIGN PATENT DOCUMENTS

JP    09-192573    7/1997

(Continued)

OTHER PUBLICATIONS

Stephen Y. Chou, et al., "Nanoimprint Lithography", J. Vac. Sci. Technol. B 14(6), Nov./Dec. 1996, pp. 4129-4133.

(Continued)

*Primary Examiner*—Yogendra N Gupta
*Assistant Examiner*—Emmanuel S Luk
(74) *Attorney, Agent, or Firm*—Pillsbury Winthrop Shaw Pittman LLP

(57) ABSTRACT

A lithographic apparatus is disclosed that has a first substrate table arranged to hold a substrate and a second substrate table arranged to hold a substrate, an imprint template holder arranged to hold an imprint template, and an imprintable medium dispenser, wherein the first substrate table is moveable between a first position located at or adjacent to the imprintable medium dispenser, and a second position located at or adjacent to the imprint template holder, and the second substrate table is moveable between the first and second positions, such that the first and second substrate tables swap positions.

26 Claims, 11 Drawing Sheets

U.S. PATENT DOCUMENTS

| | | | |
|---|---|---|---|
| 6,656,341 B2 | 12/2003 | Petersson et al. | 205/667 |
| 6,696,220 B2 | 2/2004 | Bailey et al. | 430/272.1 |
| 6,719,915 B2 | 4/2004 | Willson et al. | 216/44 |
| 6,876,439 B2 | 4/2005 | Galburt et al. | 355/77 |
| 6,921,615 B2 | 7/2005 | Sreenivasan et al. | 430/22 |
| 6,932,934 B2 * | 8/2005 | Choi et al. | 264/496 |
| 6,943,117 B2 * | 9/2005 | Jeong et al. | 438/694 |
| 7,046,331 B2 | 5/2006 | Rossing et al. | 355/53 |
| 2002/0093122 A1 | 7/2002 | Choi et al. | 264/401 |
| 2002/0094496 A1 | 7/2002 | Choi et al. | 430/322 |
| 2002/0132482 A1 | 9/2002 | Chou | 438/692 |
| 2002/0167117 A1 | 11/2002 | Chou | 264/338 |
| 2002/0177319 A1 | 11/2002 | Chou | 438/690 |
| 2003/0034329 A1 | 2/2003 | Chou | 216/44 |
| 2003/0080471 A1 | 5/2003 | Chou | 264/338 |
| 2003/0080472 A1 | 5/2003 | Chou | 264/338 |
| 2003/0081193 A1 | 5/2003 | White et al. | 355/72 |
| 2003/0127580 A1 | 7/2003 | Ling et al. | 249/115 |
| 2003/0139042 A1 | 7/2003 | Heidari | 438/689 |
| 2003/0141291 A1 | 7/2003 | Heidari et al. | 219/460.1 |
| 2003/0159608 A1 | 8/2003 | Heidari | 101/494 |
| 2003/0170053 A1 | 9/2003 | Montelius et al. | 399/318 |
| 2003/0189273 A1 | 10/2003 | Olsson | 264/293 |
| 2004/0005444 A1 | 1/2004 | Heidari | 428/212 |
| 2004/0009673 A1 | 1/2004 | Sreenivasan et al. | 438/694 |
| 2004/0021866 A1 | 2/2004 | Watts et al. | 356/401 |
| 2004/0022888 A1 | 2/2004 | Sreenivasan et al. | 425/174.4 |
| 2004/0036201 A1 | 2/2004 | Chou et al. | 264/402 |
| 2004/0046288 A1 | 3/2004 | Chou | 264/479 |
| 2004/0081798 A1 | 4/2004 | Lee et al. | 428/141 |
| 2004/0124566 A1 | 7/2004 | Sreenivasan et al. | 264/494 |
| 2004/0149367 A1 | 8/2004 | Olsson et al. | 156/64 |
| 2004/0169003 A1 | 9/2004 | Lee et al. | 216/4 |
| 2004/0192041 A1 | 9/2004 | Jeong et al. | 438/689 |
| 2004/0200411 A1 | 10/2004 | Willson et al. | 118/500 |
| 2004/0209470 A1 | 10/2004 | Bajorek | 438/689 |
| 2004/0219249 A1 | 11/2004 | Chung et al. | 425/385 |
| 2004/0219461 A1 | 11/2004 | Chung et al. | 430/311 |
| 2005/0039618 A1 | 2/2005 | Heidari et al. | 101/368 |
| 2005/0064054 A1 | 3/2005 | Kasumi | 425/112 |
| 2005/0078287 A1 | 4/2005 | Sengers et al. | 355/30 |
| 2005/0116370 A1 | 6/2005 | Ogino et al. | 264/40.1 |
| 2005/0160011 A1 | 7/2005 | Sreenivasan et al. | |
| 2005/0178280 A1 | 8/2005 | Lee et al. | 101/453 |
| 2006/0139614 A1 | 6/2006 | Owa et al. | |
| 2006/0227312 A1 * | 10/2006 | Owa et al. | 355/72 |
| 2007/0093079 A1 | 4/2007 | Aruga et al. | |
| 2007/0132152 A1 * | 6/2007 | Choi et al. | 264/401 |
| 2007/0170617 A1 | 7/2007 | Choi et al. | |

FOREIGN PATENT DOCUMENTS

| | | |
|---|---|---|
| JP | 11-340129 A | 12/1999 |
| JP | 2000-289037 | 10/2000 |
| JP | 2000-326350 A | 11/2000 |
| JP | 2002-93748 | 3/2002 |
| JP | 2003-112098 | 4/2003 |
| JP | 2003-249443 A | 9/2003 |
| JP | 2005-45168 A | 2/2005 |
| JP | 2005-286061 A | 10/2005 |
| WO | WO 01/79591 A1 | 10/2001 |
| WO | WO 01/79592 A1 | 10/2001 |
| WO | 2004/112108 A1 | 12/2004 |
| WO | WO 2005-010986 A1 | 2/2005 |

OTHER PUBLICATIONS

Heon Lee et al., Full Wafer Scale Near Zero Residual Nano-Imprinting Lithography Using UV Curable Monomer Solution, Microelectronic Engineering 77 (2005) pp. 42-47.

European Search Report for European Patent Application No. 062554420.9, issued Apr. 27, 2007.

European Search Report issued for European Patent Application No. 06255420.9—1226, dated Feb. 19, 2007.

Notice of Reasons for Rejection for Japanese Patent Application No. 2006-296405 dated Jul. 16, 2009.

Klaus Simon, U.S. Appl. No. 11/364,497, filed Mar. 1, 2006.

Notice of Reasons for Rejection for Japanese Patent Application No. 2006-296405 dated May 17, 2010.

Notice of Reasons for Rejection for Japanese Patent Application No. 2009-237982 dated Jun. 9, 2010.

* cited by examiner

IMPRINT LITHOGRAPHY

CROSS-REFERENCE TO RELATED APPLICATIONS

This application claims the benefit of U.S. Provisional Patent Application No. 60/733,175, which was filed on Nov. 4, 2005 and is hereby incorporated in its entirety by reference.

FIELD

The present invention relates to imprint lithography.

BACKGROUND

A lithographic apparatus is a machine that applies a desired pattern onto a target portion of a substrate. Lithographic apparatus are conventionally used, for example, in the manufacture of integrated circuits (ICs), flat panel displays and other devices involving fine structures.

It is desirable to reduce the size of features in a lithographic pattern because this allows for a greater density of features on a given substrate area. In photolithography, the increased resolution may be achieved by using radiation of shorter wavelength. However, there are problems associated with such reductions. Current systems are starting to adopt optical sources with wavelengths in the 193 nm regime but even at this level, diffraction limitations become a barrier. At lower wavelengths, the transparency of materials is very poor. Optical lithography machines capable of enhanced resolutions require complex optics and rare materials and are consequently very expensive.

An alternative for printing sub–100 nm features, known as imprint lithography, comprises transferring a pattern to a substrate by imprinting a pattern into an imprintable medium using a physical mould or template. The imprintable medium may be the substrate or a material coated on to a surface of the substrate. The imprintable medium may be functional or may be used as a "mask" to transfer a pattern to an underlying surface. The imprintable medium may, for instance, be provided as a resist deposited on a substrate, such as a semiconductor material, into which the pattern defined by the template is to be transferred. Imprint lithography is thus essentially a moulding process on a micrometer or nanometer scale in which the topography of a template defines the pattern created on a substrate. Patterns may be layered as with optical lithography processes so that, in principle, imprint lithography could be used for such applications as IC manufacture.

Advantages of imprint processes include that they generally do not require expensive optics, advanced illumination sources or specialized resist materials that are often required in optical lithography processes.

SUMMARY

According to a first aspect of the present invention there is provided an imprint lithography apparatus comprising a first substrate table arranged to hold a substrate and a second substrate table arranged to hold a substrate, an imprint template holder arranged to hold an imprint template, and an imprintable medium dispenser, wherein the first substrate table is moveable between a first position located at or adjacent to the imprintable medium dispenser, and a second position located at or adjacent to the imprint template holder; and the second substrate table is moveable between the first and second positions, such that the first and second substrate tables swap positions.

According to a second aspect of the invention there is provided an imprint lithography apparatus comprising a first substrate table arranged to hold a substrate and a second substrate table arranged to hold a substrate, an imprint template, and a dispenser for dispensing imprintable medium, wherein the first substrate table is moveable between a first position located at or adjacent to the imprintable medium dispenser, and a second position located at or adjacent to the imprint template; and the second substrate table is moveable between the first and second positions, such that the first and second substrate tables swap positions.

According to a third aspect of the invention there is provided an imprint lithography apparatus comprising a substrate table arranged to hold a substrate, an imprint template holder arranged to hold an imprint template, and at least two imprintable medium dispensers, a first of the imprintable medium dispensers being located at or adjacent to one side of the imprint template holder, and a second of the imprintable medium dispensers being located at or adjacent to an opposite side of the imprint template holder.

According to a fourth aspect of the invention there is provided an imprint lithography apparatus comprising a substrate table arranged to hold a substrate, an imprint template, and at least two imprintable medium dispensers, a first of the imprintable medium dispensers being located at or adjacent to one side of the imprint template, and a second of the imprintable medium dispensers being located at or adjacent to an opposite side of the imprint template.

According to a fifth aspect of the invention there is provided an imprint lithography apparatus comprising a substrate table arranged to hold a substrate; one or more first template holders at a first position; and one or more second template holders at a second position, wherein the substrate table is movable between the first and second positions.

One or more embodiments of the present invention are applicable to any imprint lithography process in which a patterned template is imprinted into an imprintable medium in a flowable state, and for instance can be applied to hot and UV imprint lithography as described above. For the purpose of understanding one or more embodiments of the present invention, it is not necessary to describe the imprint process in any more detail than has already been given and is known in the art.

Further features of one or more embodiments of the present invention will be apparent from the following description.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

There are two principal approaches to imprint lithography which will be termed generally as hot imprint lithography and UV imprint lithography. There is also a third type of "printing" lithography known as soft lithography. Examples of these are illustrated in FIGS. 1a to 1c.

Figure 1A:
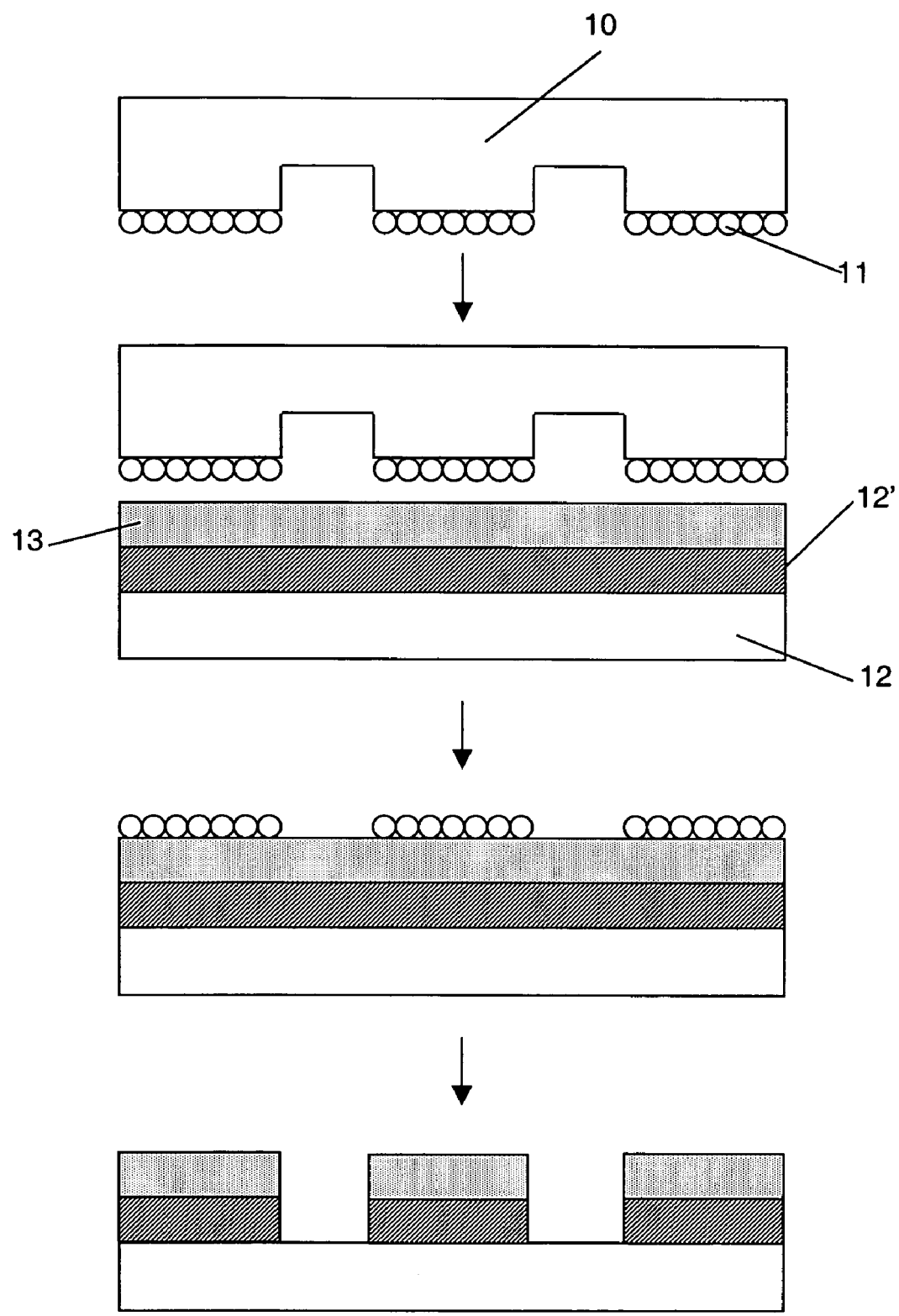
FIGS. 1a-1c illustrate examples of conventional soft, hot and UV lithography processes respectively.
Figure 1B:
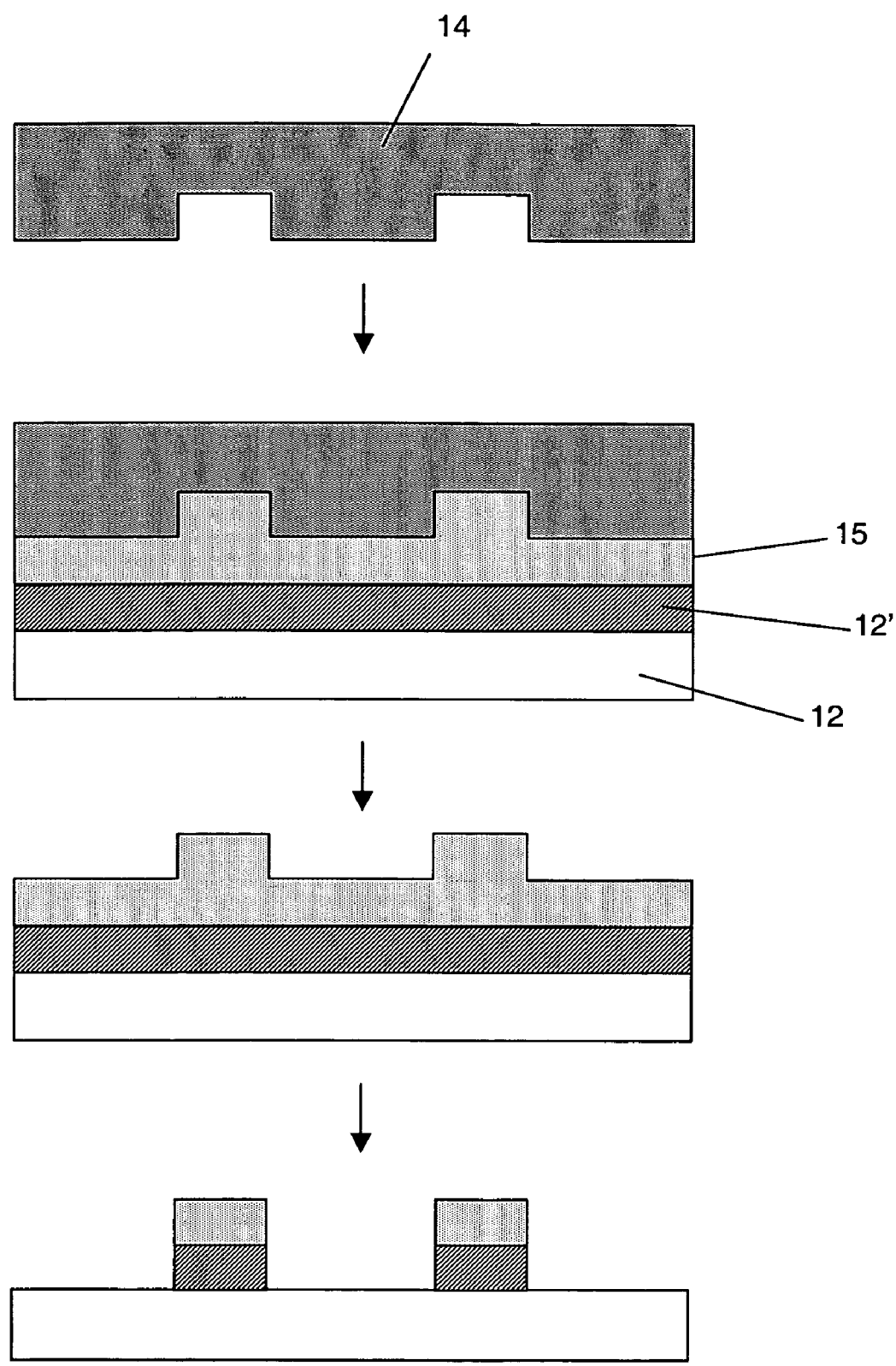
Figure 1C:
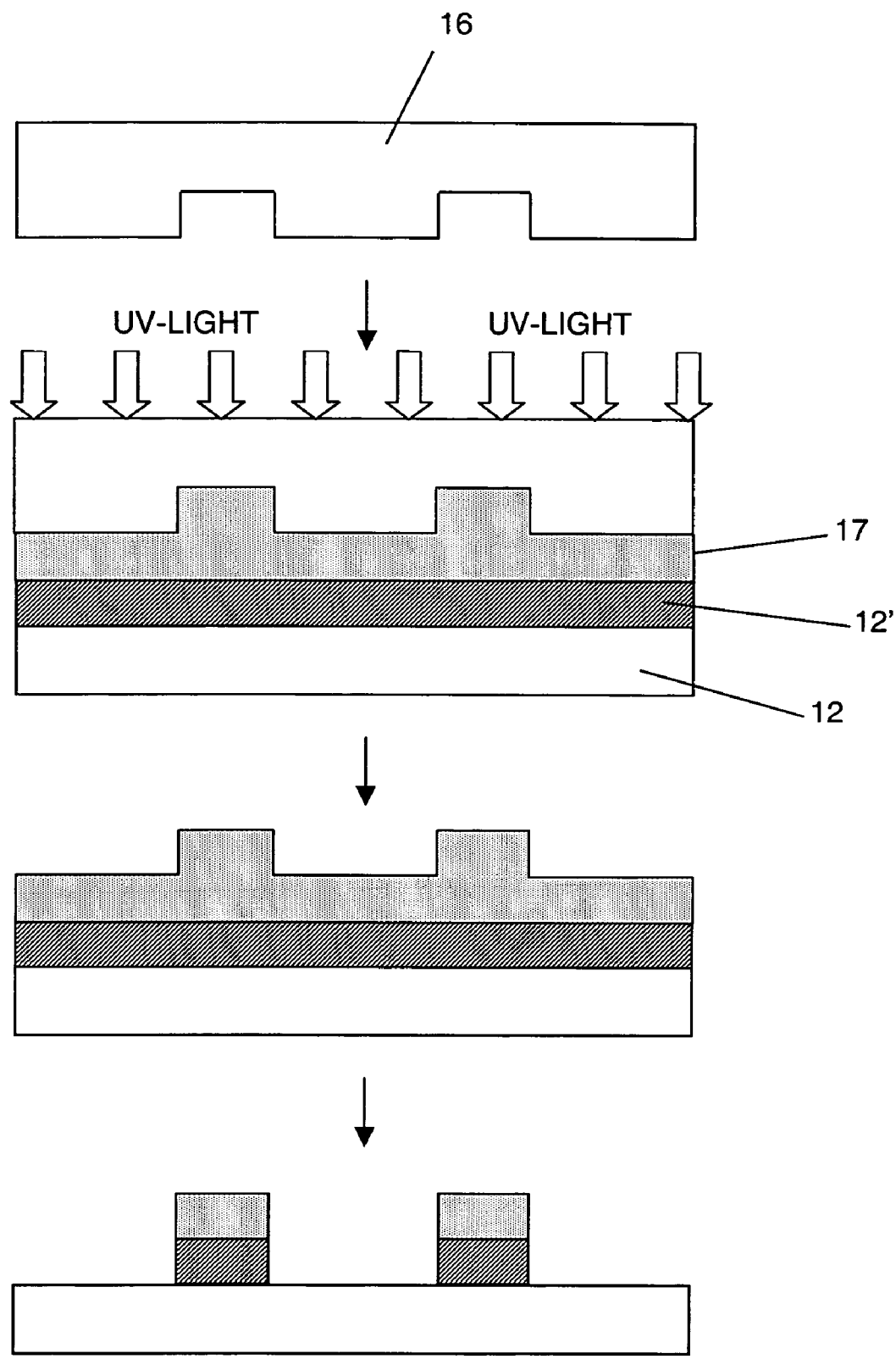

FIG. 1a schematically depicts the soft lithography process which involves transferring a layer of molecules 11 (typically an ink such as a thiol) from a flexible template 10 (typically fabricated from polydimethylsiloxane (PDMS)) onto a resist layer 13 which is supported upon a substrate 12 and planarization and transfer layer 12'. The template 10 has a pattern of features on its surface, the molecular layer being disposed upon the features. When the template is pressed against the resist layer, the layer of molecules 11 stick to the resist. Upon removal of the template from the resist, the layer of molecules 11 stick to the resist, the residual layer of resist is etched such that the areas of the resist not covered by the transferred molecular layer are etched down to the substrate.

The template used in soft lithography may be easily deformed and may therefore not be suited to high resolution applications, e.g. on a nanometer scale, since the deformation of the template may adversely affect the imprinted pattern. Furthermore, when fabricating multiple layer structures, in which the same region will be overlaid multiple times, soft imprint lithography may not provide overlay accuracy on a nanometer scale.

Hot imprint lithography (or hot embossing) is also known as nanoimprint lithography (NIL) when used on a nanometer scale. The process uses a harder template made from, for example, silicon or nickel, which are more resistant to wear and deformation. This is described for instance in U.S. Pat. No. 6,482,742 and illustrated in FIG. 1b. In a typical hot imprint process, a solid template 14 is imprinted into a thermosetting or a thermoplastic polymer resin 15, which has been cast on the surface of a substrate 12. The resin may, for instance, be spin coated and baked onto the substrate surface or more typically (as in the example illustrated) onto a planarization and transfer layer 12'. It should be understood that the term "hard" when describing an imprint template includes materials which may generally be considered between "hard" and "soft" materials, such as for example "hard" rubber. The suitability of a particular material for use as an imprint template is determined by its application requirements.

When a thermosetting polymer resin is used, the resin is heated to a temperature such that, upon contact with the template, the resin is sufficiently flowable to flow into the pattern features defined on the template. The temperature of the resin is then increased to thermally cure (e.g. crosslink) the resin so that it solidifies and irreversibly adopts the desired pattern. The template may then be removed and the patterned resin cooled.

Examples of thermoplastic polymer resins used in hot imprint lithography processes are poly (methyl methacrylate), polystyrene, poly (benzyl methacrylate) or poly (cyclohexyl methacrylate). The thermoplastic resin is heated so that it is in a freely flowable state immediately prior to imprinting with the template. It is typically necessary to heat thermoplastic resin to a temperature considerably above the glass transition temperature of the resin. The template is pressed into the flowable resin and sufficient pressure is applied to ensure the resin flows into all the pattern features defined on the template. The resin is then cooled to below its glass transition temperature with the template in place whereupon the resin irreversibly adopts the desired pattern. The pattern will consist of the features in relief from a residual layer of the resin which may then be removed by an appropriate etch process to leave only the pattern features.

Figure 2:
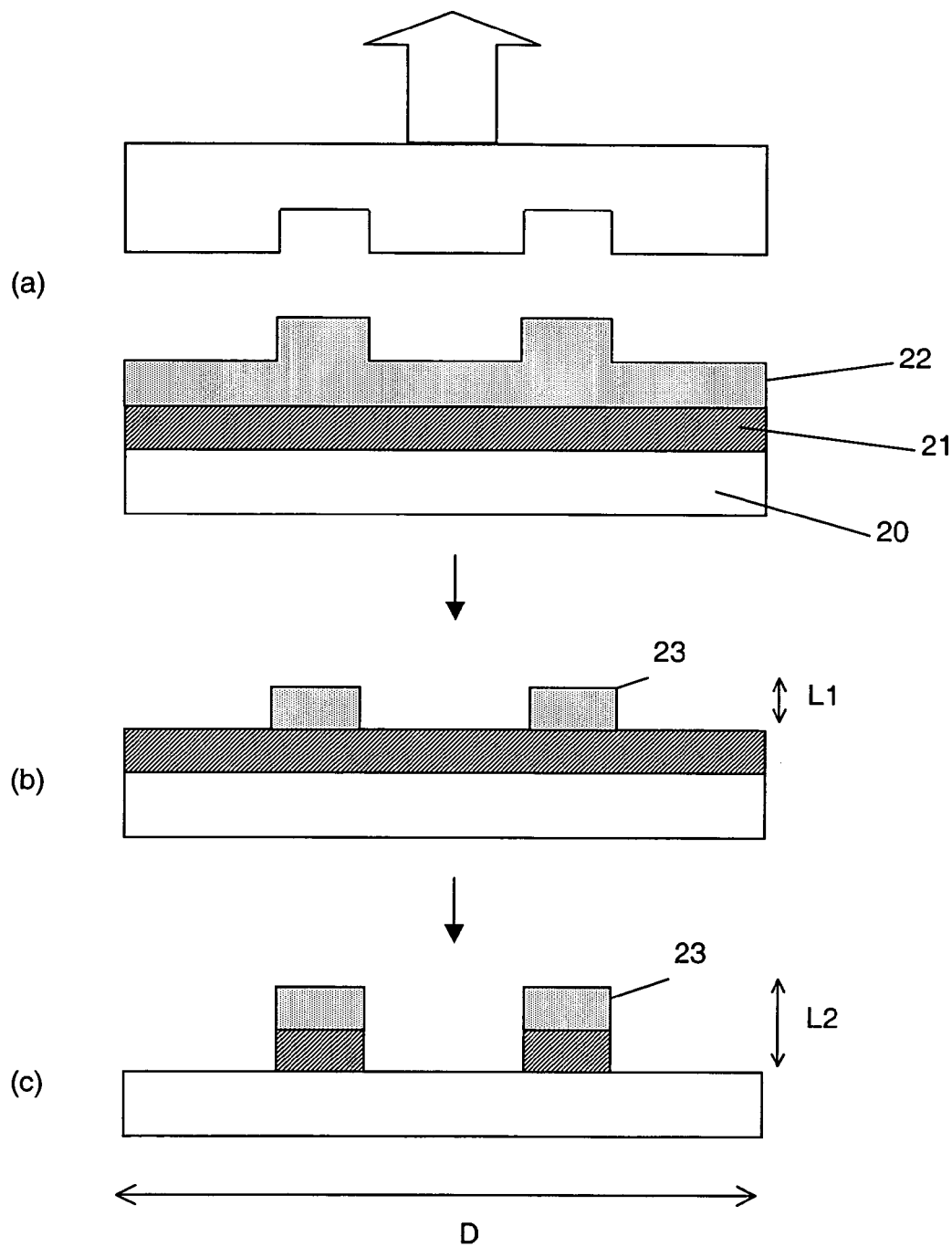
FIG. 2 illustrates a two step etching process employed when hot and UV imprint lithography is used to pattern a resist layer.

Upon removal of the template from the solidified resin, a two-step etching process is typically performed as illustrated in FIGS. 2a to 2c. The substrate 20 has a planarization and transfer layer 21 immediately upon it, as shown in FIG. 2a. The purpose of the planarization and transfer layer is twofold. It acts to provide a surface substantially parallel to that of the template, which helps ensure that the contact between the template and the resin is parallel, and also to improve the aspect ratio of the printed features, as described herein.

After the template has been removed, a residual layer 22 of the solidified resin is left on the planarization and transfer layer 21, shaped in the desired pattern. The first etch is isotropic and removes parts of the residual layer 22, resulting in a poor aspect ratio of features where L1 is the height of the features 23, as shown in FIG. 2b. The second etch is anisotropic (or selective) and improves the aspect ratio. The anisotropic etch removes those parts of the planarization and transfer layer 21 which are not covered by the solidified resin, increasing the aspect ratio of the features 23 to (L2/D), as shown in FIG. 2c. The resulting polymer thickness contrast left on the substrate after etching can be used as for instance a mask for dry etching if the imprinted polymer is sufficiently resistant, for instance as a step in a lift-off process.

Hot imprint lithography suffers from a disadvantage in that not only is the pattern transfer performed at a higher temperature, but also relatively large temperature differences might be required in order to ensure the resin is adequately solidified before the template is removed. Temperature differences between 35 and 100° C. may be needed. Differential thermal expansion between, for instance, the substrate and template may then lead to distortion in the transferred pattern. This may be exacerbated by the relatively high pressure needed for the imprinting step, due the viscous nature of the imprintable material, which can induce mechanical deformation in the substrate, again distorting the pattern.

UV imprint lithography, on the other hand, does not involve such high temperatures and temperature changes nor does it require such viscous imprintable materials. Rather, UV imprint lithography involves the use of a partially or wholly transparent template and a UV-curable liquid, typically comprising a monomer such as an acrylate or methacrylate for example. In general, any photopolymerizable material could be used, such as a mixture of monomers and an initiator. The curable liquid may also, for instance, include a dimethyl siloxane derivative. Such materials tend to be less viscous than the thermosetting and thermoplastic resins used in hot imprint lithography and consequently move faster to fill template pattern features. Low temperature and low pressure operation also favors higher throughput capabilities. Although the name 'UV imprint lithography' implies that UV radiation is always used, those skilled in the art will be aware that any suitable actinic radiation may be used (for example, visible light may be used). Hence, any reference herein to UV imprint lithography, UV radiation, UV curable materials, etc. should be interpreted as including any suitable actinic radiation, and should not be interpreted as being limited to UV radiation only.

An example of a UV imprint process is illustrated in FIG. 1c. A quartz template 16 is applied to a UV curable resin 17 in a similar manner to the process of FIG. 1b. Instead of raising the temperature as in hot embossing employing thermosetting resins, or temperature cycling when using thermoplastic resins, UV radiation is applied to the resin through the quartz template in order to polymerize and thus cure it. Upon removal of the template, the remaining steps of etching the residual layer of resist are the same or similar as for the hot embossing process described herein. The UV curable resins typically used have a much lower viscosity than typical thermoplastic resins so that lower imprint pressures may be used. Reduced physical deformation due to the lower pressures, together with reduced deformation due to high temperatures and temperature changes, makes UV imprint lithography suited to applications requiring high overlay accuracy. In addition, the transparent nature of UV imprint templates can accommodate optical alignment techniques simultaneously to the imprinting.

Although this type of imprint lithography mainly uses UV curable materials, and is thus generically referred to as UV imprint lithography, other wavelengths of radiation may be used to cure appropriately selected materials (e.g., activate a polymerization or cross linking reaction). In general, any radiation capable of initiating such a chemical reaction may be used if an appropriate imprintable material is available. Alternative "activating radiation" may, for instance, include visible light, infrared radiation, x-ray radiation and electron beam radiation. In the general description herein, references to UV imprint lithography and use of UV radiation are not intended to exclude these and other activating radiation possibilities.

As an alternative to imprint systems using a planar template which is maintained substantially parallel to the substrate surface, roller imprint systems have been developed. Both hot and UV roller imprint systems have been proposed in which the template is formed on a roller but otherwise the imprint process is very similar to imprinting using a planar template. Unless the context requires otherwise, references to an imprint template include references to a roller template.

There is a particular development of UV imprint technology known as step and flash imprint lithography (SFIL) which may be used to pattern a substrate in small steps in a similar manner to optical steppers conventionally used, for example, in IC manufacture. This involves printing small areas of the substrate at a time by imprinting a template into a UV curable resin, 'flashing' UV radiation through the template to cure the resin beneath the template, removing the template, stepping to an adjacent region of the substrate and repeating the operation. The small field size of such step and repeat processes may help reduce or minimize pattern distortions and CD variations so that SFIL may be particularly suited to manufacture of IC and other devices requiring high overlay accuracy.

Although in principle the UV curable resin can be applied to the entire substrate surface, for instance by spin coating, this may be problematic when relatively volatile UV curable resins are employed.

One approach to addressing this problem is the so-called 'drop on demand' process in which the resin is dispensed onto a target portion of the substrate in droplets immediately prior to imprinting with the template. The liquid dispensing is controlled so that a certain volume of liquid is deposited on a particular target portion of the substrate. The liquid may be dispensed in a variety of patterns and the combination of carefully controlling liquid volume and placement of the pattern can be employed to confine patterning to the target area.

Dispensing the resin on demand as mentioned is not a trivial matter. The size and spacing of the droplets are carefully controlled to ensure there is sufficient resin to fill template features while at the same time minimizing excess resin which can be rolled to an undesirably thick or uneven residual layer since as soon as neighboring drops touch fluid, the resin will have nowhere to flow.

Although reference is made herein to depositing UV curable liquids onto a substrate, the liquids could also be deposited on the template and in general the same techniques and considerations will apply.

Figure 3:
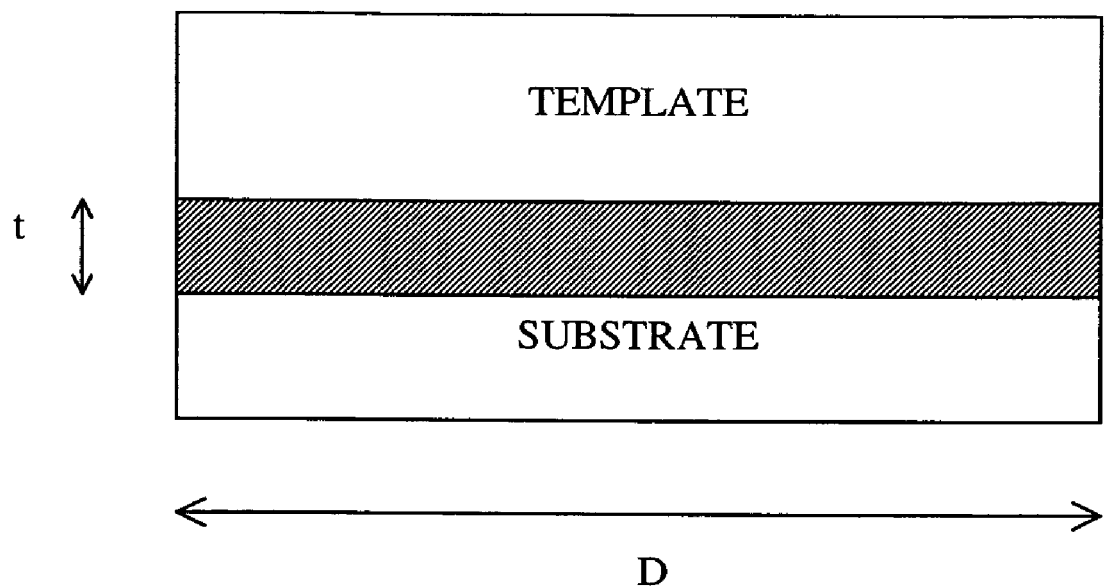
FIG. 3 schematically illustrates a template and a typical imprintable resist layer deposited on a substrate.

FIG. 3 illustrates the relative dimensions of the template, imprintable material (curable monomer, thermosetting resin, thermoplastic, etc) and substrate. The ratio of the width of the substrate, D, to the thickness of the curable resin layer, t, is of the order of $10^6$. It will be appreciated that, in order to avoid the features projecting from the template damaging the substrate, the dimension t should be greater than the depth of the projecting features on the template.

The residual layer left after stamping is useful in protecting the underlying substrate, but as mentioned herein it may also be the source of a problem, particularly when high resolution and/or minimum CD (critical dimension) variation is desired. The first 'breakthrough' etch is isotropic (non-selective) and will thus to some extent erode the features imprinted as well as the residual layer. This may be exacerbated if the residual layer is overly thick and/or uneven. This problem may, for instance, lead to variation in the thickness of lines ultimately formed in the underlying substrate (i.e. variation in the critical dimension). The uniformity of the thickness of a line that is etched in the transfer layer in the second anisotropic etch is dependant upon the aspect ratio and integrity of the shape of the feature left in the resin. If the residual resin layer is uneven, then the non-selective first etch can leave some of these features with "rounded" tops so that they are not sufficiently well defined to ensure good uniformity of line thickness in the second and any subsequent etch process. In principle, the above problem may be reduced by ensuring the residual layer is as thin as possible but this can require application of undesirably large pressures (possibly increasing substrate deformation) and relatively long imprinting times (possibly reducing throughput).

The template is a significant component of the imprint lithography system. As noted herein, the resolution of the features on the template surface is a limiting factor on the attainable resolution of features printed on the substrate. The templates used for hot and UV lithography are generally formed in a two-stage process. Initially, the desired pattern is written using, for example, electron beam writing (e.g., with an electron beam pattern generator), to give a high resolution pattern in resist. The resist pattern is then transferred into a thin layer of chrome which forms the mask for the final, anisotropic etch step to transfer the pattern into the base material of the template. Other techniques such as for example ion-beam lithography, X-ray lithography, extreme UV lithography, epitaxial growth, thin film deposition, chemical etching, plasma etching, ion etching or ion milling could be used. Generally, a technique capable of very high resolution will be used as the template is effectively a 1x mask with the resolution of the transferred pattern being limited by the resolution of the pattern on the template.

The release characteristics of the template may also be a consideration. The template may, for instance, be treated with a surface treatment material to form a thin release layer on the template having a low surface energy (a thin release layer may also be deposited on the substrate).

Another consideration in the development of imprint lithography is the mechanical durability of the template. The template may be subjected to large forces during stamping of the resist, and in the case of hot lithography, may also be subjected to extremes of pressure and temperature. This may cause wearing of the template, and may adversely affect the shape of the pattern imprinted upon the substrate.

In hot imprint lithography, there is a potential advantage in using a template of the same or similar material to the substrate to be patterned in order to reduce differential thermal expansion between the two. In UV imprint lithography, the template is at least partially transparent to the activation radiation and often quartz templates are used.

Although specific reference may be made in this text to the use of imprint lithography in the manufacture of ICs, it should be understood that imprint apparatus and methods described may have other applications, such as the manufacture of integrated optical systems, guidance and detection patterns for magnetic domain memories, hard disc magnetic media, flat panel displays, thin-film magnetic heads, etc.

While in the description herein, particular reference has been made to the use of imprint lithography to transfer a template pattern to a substrate via an imprintable resin effectively acting as a resist, in some circumstances the imprintable material may itself be a functional material, for instance having a functionally such as electrical or thermal conductivity, optical linear or non-linear response, among others. For example, the functional material may form a conductive layer, a semi-conductive layer, a dielectric layer or a layer having another desirable mechanical, electrical or optical property. Some organic substances may also be appropriate functional materials. Such applications may be within the scope an embodiment of the present invention.

Figure 4:
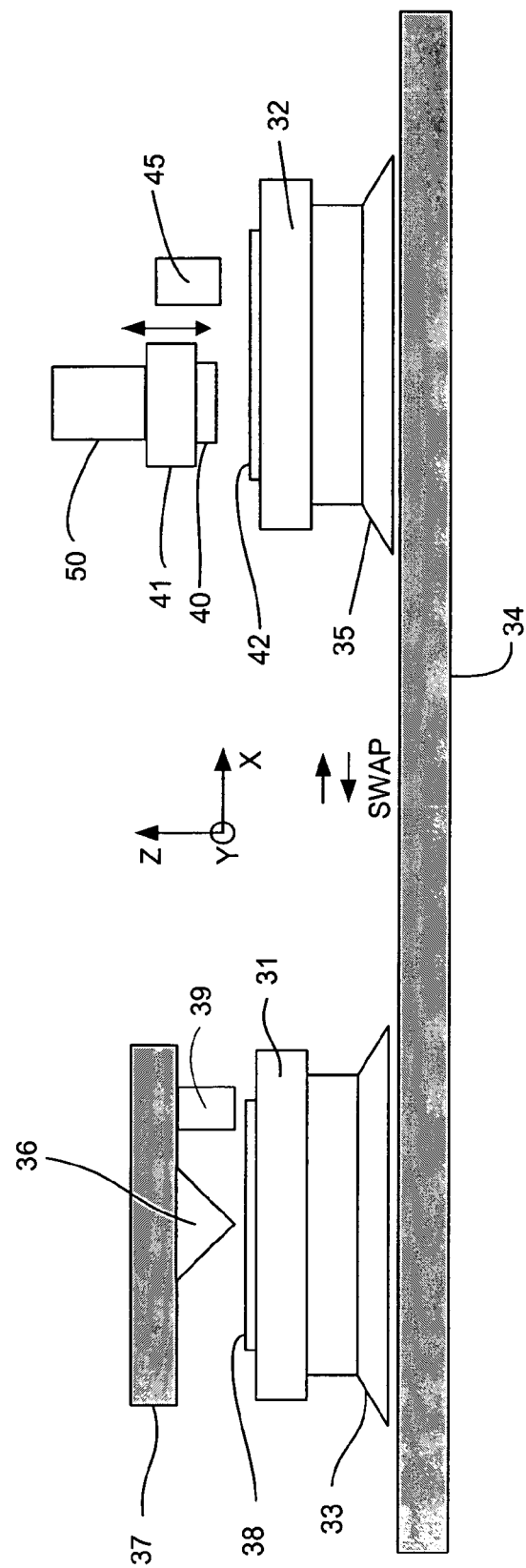
FIGS. 4 to 6 schematically show an embodiment of an imprint lithographic apparatus according to the invention.

FIG. 4 shows schematically an imprint lithography apparatus according to an embodiment of the invention. The imprint lithography apparatus comprises a first substrate table 31 and a second substrate table 32. The first substrate table 31 is provided with a gas (e.g., air) foot 33 which rests upon a base plate 34 of the apparatus. The gas foot 34 is arranged such that gas at a predetermined pressure is passed to the gas foot and establishes a cushion of gas which supports the gas foot on the base plate 33. This allows the gas foot 34 and the substrate table 31 to move smoothly over the base plate 34. The second substrate table 32 is also provided with a gas foot 35.

A dispenser 36 configured to dispense imprintable medium is fixed to a mounting 37. The imprintable medium dispenser 36 may be, for example, an inkjet nozzle which deposits droplets of imprintable medium. It may, for example, comprise an array of inkjet nozzles. Suitable configurations of inkjet nozzle arrays will be known to those skilled in the art.

A first alignment system 39, which may be, for example, an optical diffraction based system or an image recognition based system, is arranged to align one or more target portions of the first substrate 38 with respect to one or more alignment marks provided on the first substrate table 31. This may be done, for example, by determining a position of an alignment mark on the first substrate 38 with respect to an alignment mark on the first substrate table 31.

A substrate 38, referred to as the first substrate, is provided on the first substrate table 31. The substrate 38 receives droplets of imprintable medium deposited by the imprintable medium dispenser 36. The droplets of imprintable medium may be provided across the entire useable surface of the substrate 38. Alternatively, the droplets may be provided on a pre-selected portion of the substrate 38.

The second substrate table 32 is located beneath an imprint template 40 which is held in a template holder 41. A lowermost surface of the imprint template 40 is provided with a pattern. The imprint template 40 and the template holder 41 are moveable in the Z-direction, as indicated by the arrow located adjacent the imprint template holder. A substrate 42, referred to as the second substrate, is provided on the second substrate table 32.

In use, the imprintable medium dispenser 36 dispenses droplets of imprintable medium onto the first substrate 38, at the same time that the imprint template 40 is imprinting a pattern onto the second substrate 42. This process is described in more detail below.

Initially, there is no substrate provided on the first substrate table 31. A substrate handler (not illustrated) passes a substrate onto the first substrate table 31. In FIG. 4 this substrate is the first substrate 38. The first substrate 38 is positioned to within a predetermined accuracy on the first substrate table 31. This is so that all desired useable areas of the first substrate 38 may be accurately reached by the imprintable medium dispenser 36, and at a later time by the imprint template 40. A vacuum is applied through a multiplicity of openings provided in the first substrate table 31, thereby securing the first substrate 38 to the first substrate table such that it will not move over the first substrate table.

The first alignment system 39 is used to determine the position of an alignment mark on the first substrate 38 with respect to an alignment mark on the first substrate table 31. This is done by translating the first substrate table 31 beneath the alignment system 39. Deviation of the position of a target portion from its expected position is determined. Since the first substrate 38 is firmly secured to the first substrate table 31, the position of a target portion on the first substrate with respect to an alignment mark on the first substrate table 31 will not change following the alignment measurement.

The first substrate table 31 is translated through a predetermined route, such that all desired usable areas of the first substrate pass beneath the imprintable medium dispenser 36. The imprintable medium dispenser 36 dispenses droplets of imprintable medium onto the first substrate 38 while it is being translated through the predetermined route. The imprintable medium may be provided as arrays of droplets, formations of which will be apparent to those skilled in the art. The precise positions at which the droplets of imprintable medium are provided on the first substrate 38 may be determined with reference to the alignment measurement.

At the same time that imprintable medium is being provided on the first substrate 38, a pattern is being imprinted onto the second substrate 42 (the second substrate has already been provided with imprintable medium).

A second alignment system 45, which may be, for example, an optical diffraction based system or an image recognition based system, is used to measure the locations of one or more alignment marks provided on the second substrate table 32. This allows the position of a target portion of the second substrate 42 to be determined, so that it can be aligned with the imprint template 40. Once a desired target portion has been aligned with the imprint template 40, the template holder 41 is moved downward in the Z-direction until it presses the imprint template 40 into imprintable medium provided on the second substrate 42. The region of imprintable medium located beneath the imprint template 40 is then illuminated with UV radiation, which may be generated, for example, by a UV source 50.

The UV source 50, template holder 41, and imprint template 40 are arranged such that the UV radiation is only incident upon the portion of imprintable medium which is located beneath the imprint template. This may be achieved, for example, by the use of one or more screens or by appropriate application of a coating to one or more sides of the imprint template 40 and template holder 41 which is opaque to UV radiation. It will be appreciated by those skilled in the art that instead of UV radiation any suitable wavelength may be used to illuminate the imprintable medium (i.e. any suitable actinic radiation may be used). For ease of terminology the term 'UV radiation' will continue to be used in this description.

Once the imprintable medium has been cured by the UV radiation, the imprint template holder 41 and imprint template 40 are moved upwards in the Z-direction and away from the second substrate 42. The second substrate table 32 is then moved such that a second target portion is located beneath the imprint template. The imprint process is then repeated.

Instead of having an imprint template 40 which is dimensioned to imprint a single target portion of the second substrate 42, a larger imprint template may be used. For example the imprint template may be dimensioned such that the entire second substrate 42, or a substantial portion of the second substrate, is imprinted with a pattern during a single imprint process.

Once the imprinting of patterns onto the second substrate 42 has been completed, and dispensing of imprintable medium onto the first substrate 38 has been completed, the substrate tables 31 and 32 are swapped over into opposite positions. In an embodiment, this is achieved by moving the substrate tables 31, 32 (using the gas feet 33, 35) in the Y-direction so that they will not collide, then moving the first substrate table 31 in the positive X-direction and moving the second substrate table 32 in the negative X-direction. In general terms, the first substrate table moves from a first position located at or adjacent to the imprintable medium dispenser to a second position located at or adjacent to the imprint template holder. The second substrate table moves from the second position to the first position.

The precise locations of the substrate tables 31, 32 may be monitored using interferometers (not shown) when they are in the first and second positions. The interferometers may be arranged such that a first set of interferometers measure the position of the substrate table which is in the first position, regardless of which specific substrate table that is, and similarly a second set of interferometers measure the position of the substrate table which is in the second position. The interferometers need not necessarily monitor the positions of the substrate tables 31, 32 during the entire position swapping process.

The vacuum applied by the second substrate table 32 is released, so that the second substrate 42 is removable from the second substrate table. The second substrate 42 is then removed from the second substrate table 32 by the substrate handler. Following this a new substrate is placed on the second substrate table 32. The new substrate is provided with imprintable medium using the imprintable medium dispenser 36, in the manner described above.

The first substrate 38 is located beneath the imprint template 40, which is used to imprint a pattern onto the first substrate. Once depositing of imprintable medium onto the new substrate has been completed, and imprinting of the pattern onto the first substrate 38 has been completed, the substrate tables 31, 32 are once again swapped over into opposite positions (this is done in the same way as described above).

The embodiment of the invention provides, for example, an increase of throughput, since imprintable medium may be provided on a given substrate at the same time that a pattern is being imprinted onto a different substrate.

Figure 5:
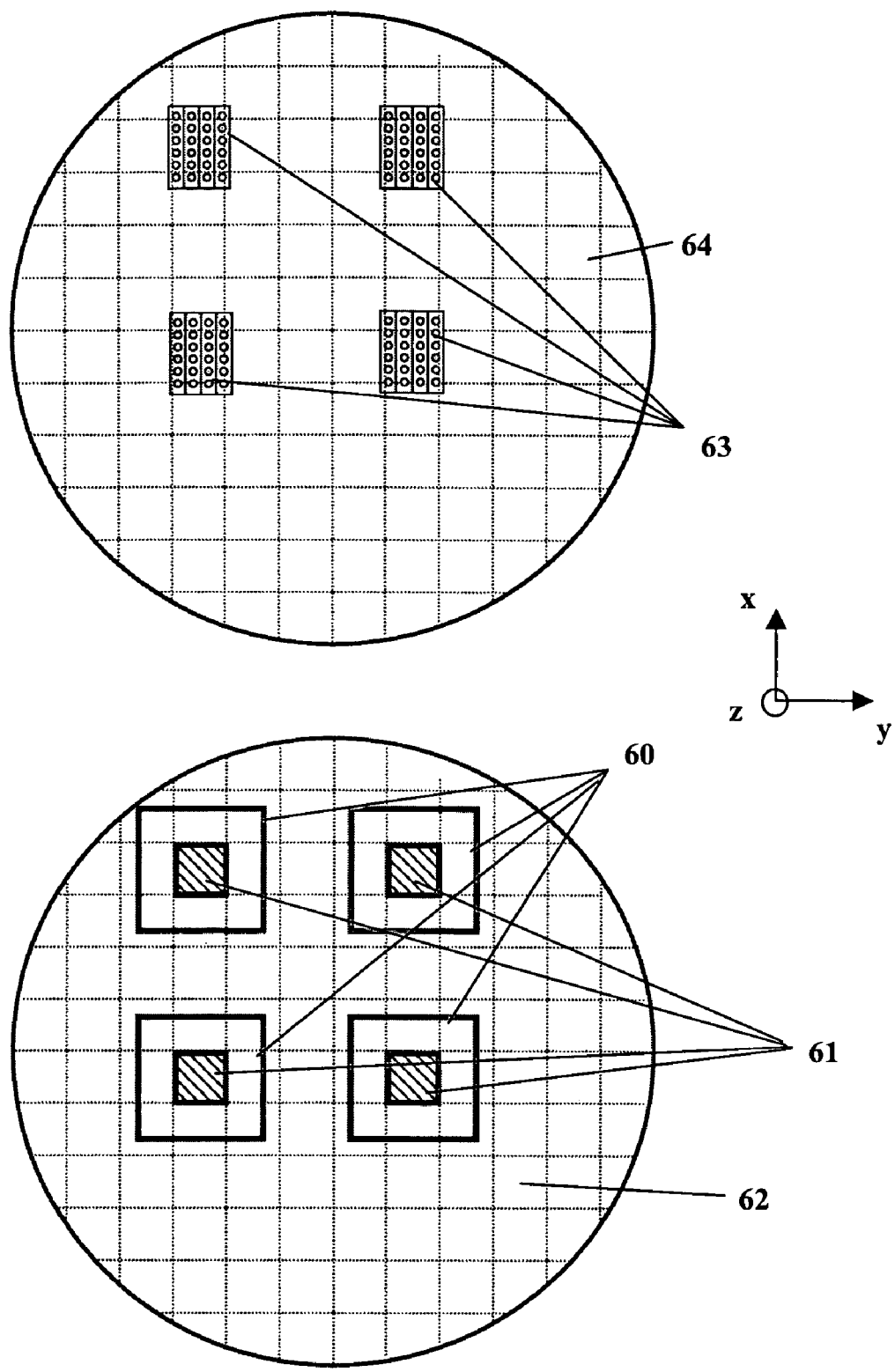

Although the embodiment of the invention described above is provided with a single imprintable medium dispenser 36 and a single imprint template, it will be appreciated that multiple imprintable medium dispensers and/or imprint templates may be used. FIG. 5 shows schematically viewed from above four imprint template holders 60, each of which holds an imprint template 61. A substrate 62 is shown beneath the imprint templates 61 and template holders 60. Collectively these elements may be considered to be at a location which is equivalent to the second position described above in relation to FIG. 4. For ease of illustration, elements such as the substrate table shown in FIG. 4 are not included in FIG. 5 (these elements will however generally be present).

Also shown in FIG. 5 are four imprintable medium dispensers 63. Each imprintable medium dispenser comprises a two dimensional array of nozzles, although it will be appreciated that a single dimensional array of nozzles may alternatively be used. A substrate 64 is shown beneath the imprintable medium dispensers 63. The imprintable medium dispensers 63 and substrate 64 are in a position which may be considered to be equivalent to the first position referred to above in relation to FIG. 4 (the apparatus may further include elements of the apparatus shown in FIG. 4).

The substrates 62, 64 are divided into a multiplicity of regions by dotted lines, these regions being intended to generally indicate target portions of the substrate.

In use, a substrate 64 is introduced at the first position, beneath the imprintable medium dispenser 63, and is moved in a scanning motion beneath the imprintable medium dispensers thereby allowing imprintable medium to be applied over the surface of the substrate. The substrate then passes to the second position, where the imprint templates 61 imprint patterns into the imprintable medium provided on a substrate. Patterns may be imprinted at each of the target portions of the substrate. Once imprinting of the target portions has been completed, ultraviolet radiation (not shown in FIG. 5) may be used to cure the imprintable medium and thereby fix the imprinted patterns in the imprintable medium.

During imprinting of the substrate by the imprint templates 61, an additional substrate is brought to the first position and is provided with imprintable medium using the imprintable medium dispensers 63. Once this has been completed, and curing of the first substrate with UV radiation has been completed, the first substrate may be passed out of the lithographic apparatus (for example for further processing) and the additional substrate may be moved to the second position. A further additional substrate may then be brought to the first position. In an alternative arrangement, the first substrate and additional substrate may be swapped between the first and second positions, such that a further layer of imprintable medium may be provided on the first substrate and patterns may be printed onto the second substrate. This process may be repeated several times.

In an embodiment, one or more of the imprint templates 61 may be replaced with one or more other imprint templates bearing different patterns one or more times during imprinting, for example to imprint different patterns onto different layers of the substrate.

Figure 6:
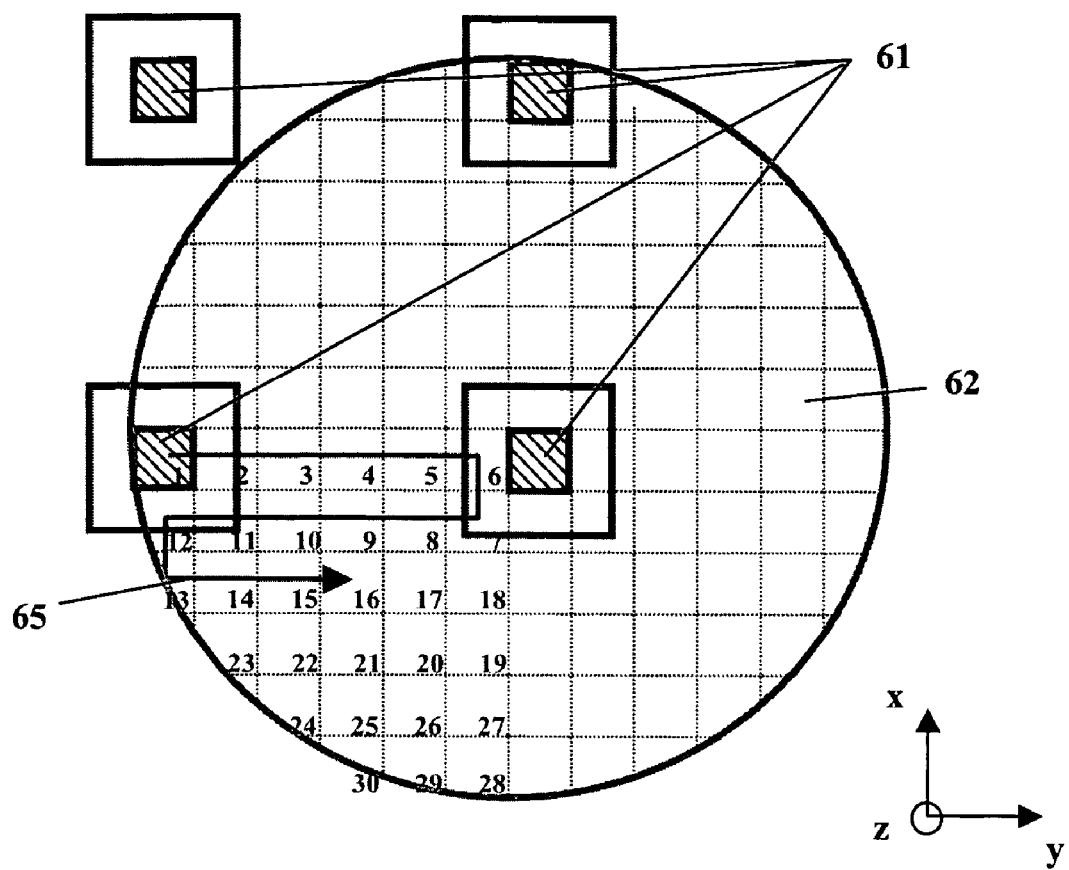

The imprint templates 60 are positioned such that the surface of the substrate 62 may be substantially fully imprinted using, in an embodiment, 30 imprint steps, as shown schematically in FIG. 6. The imprint templates 61 are fixed, and the substrate 62 passes beneath the imprint templates. For ease of illustration this is shown schematically as the imprint templates 61 moving over the substrate 62. The "motion" of the imprint template 61 with respect to the substrate 62 is shown schematically by arrows 65. The order in which target portions of the substrate 62 are imprinted is indicated by numerals which step upwards from 1 to 30. Although the arrows 65 and numerals are only shown for the bottom left hand corner of the substrate 62, it will be appreciated that equivalent arrows and numerals will apply for other areas of the substrate.

It will be appreciated that although four imprint templates 61 have been illustrated in FIGS. 5 and 6, any suitable number of imprint templates may be provided. Similarly, the separation between the imprint templates 61 may differ from that shown in the Figures. The positions of the imprint template holders 60 may be adjustable in the X and Y directions (i.e. laterally), for example to allow the distance between the imprint templates 61 to be adjusted. It may be desired to do this, for example, if imprint templates covering larger areas are used or different sized substrates are used. If, for example, an array of nine imprint templates were to be used, it will be appreciated that the number of imprint steps required in order to substantially fully imprint the substrate 62 with patterns will be reduced compared to the use of four imprint templates.

The processes described above in relation to FIG. 4 may also be performed using the apparatus described in relation to FIGS. 5 and 6. For example, the position of one or more alignment marks on the substrate may be determined using an alignment system.

The imprint templates 61 may bear the same imprint pattern or may bear different imprint patterns. This may depend, for example, upon whether a substrate is intended to provide repetitions of a single device or is intended to provide a plurality of devices.

Figure 7:
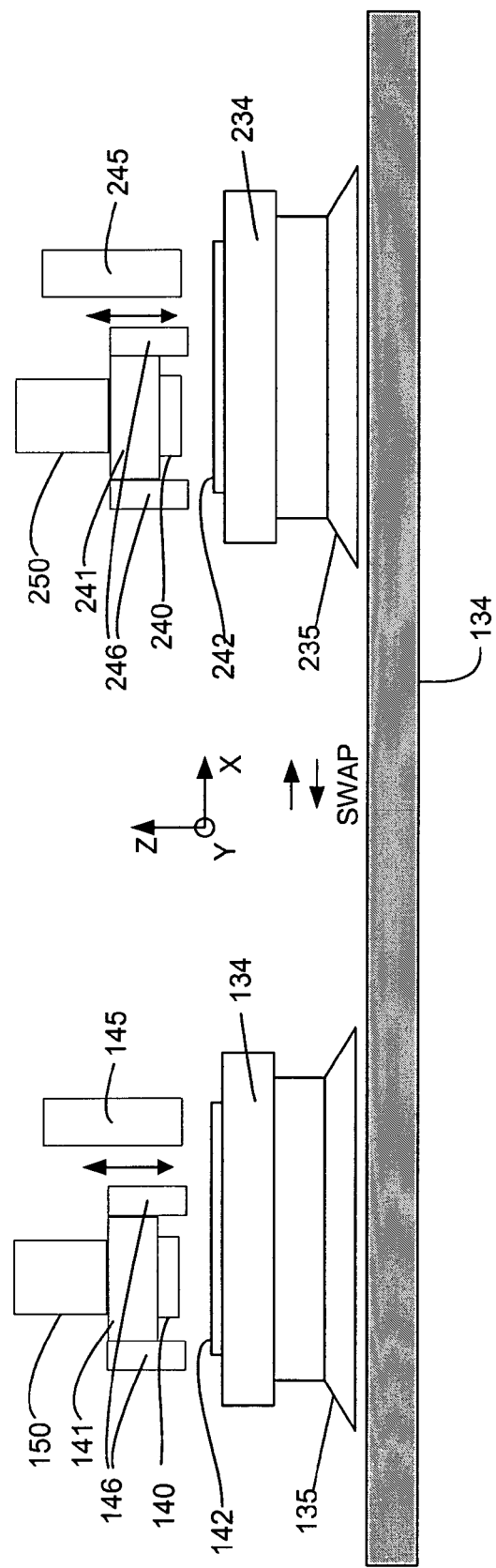
FIGS. 7 to 9 schematically show an alternative embodiment of an imprint lithographic apparatus according to the invention.

An alternative embodiment of the invention is shown schematically in FIG. 7. The embodiment shown in FIG. 7 corresponds in large part to the right hand side of FIG. 4, the principle differences being firstly that the left hand and right hand sides of FIG. 7 are substantially the same, and secondly that dispensers configured to dispense imprintable medium are provided at either side of each imprint template holder.

Referring first to the left hand side of FIG. 7, a substrate 142 is held on a substrate table 134 which is located on a gas foot 135. An imprint template holder 141 holds an imprint template 140. A UV source 150 is provided above the imprint template holder 141, and an alignment system 145 is provided to one side of the template holder. Imprintable medium dispensers 146 are provided on either side of the template holder 141.

Referring to the right hand side of FIG. 7, a substrate 242 is held on a substrate table 234 which is located on a gas foot 235. An imprint template holder 241 holds an imprint template 240. A UV source 250 is provided above the imprint template holder 241, and an alignment system 245 is provided to one side of the template holder. Imprintable medium dispensers 246 are provided on either side of the template holder 241.

The imprintable medium dispensers 146, 246 are shown viewed from below in FIG. 8. Each imprintable medium dispenser 146, 246 is provided with a series of inkjet nozzles 160. Although this is represented schematically as five openings in FIG. 8, it will be appreciated that any suitable number of inkjet nozzles may be used, and that these may be provided in a series of rows or in the form of an array instead of being provided as a single row. Other suitable apertures may be used instead of inkjet nozzles. Also shown in FIG. 8 is the underside of the imprint template holder 141, 242 and the imprint template 140, 240.

Figure 8:
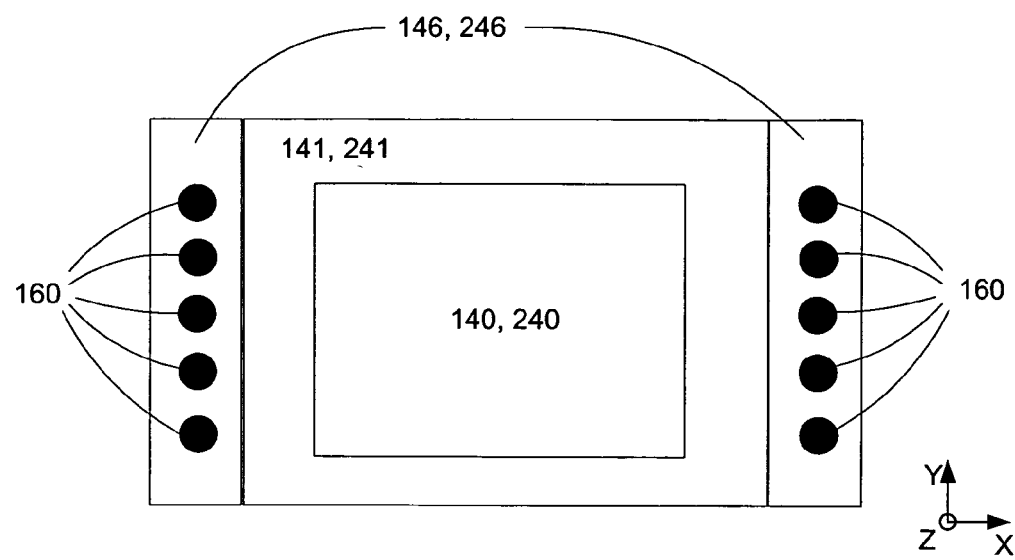
Figure 9:
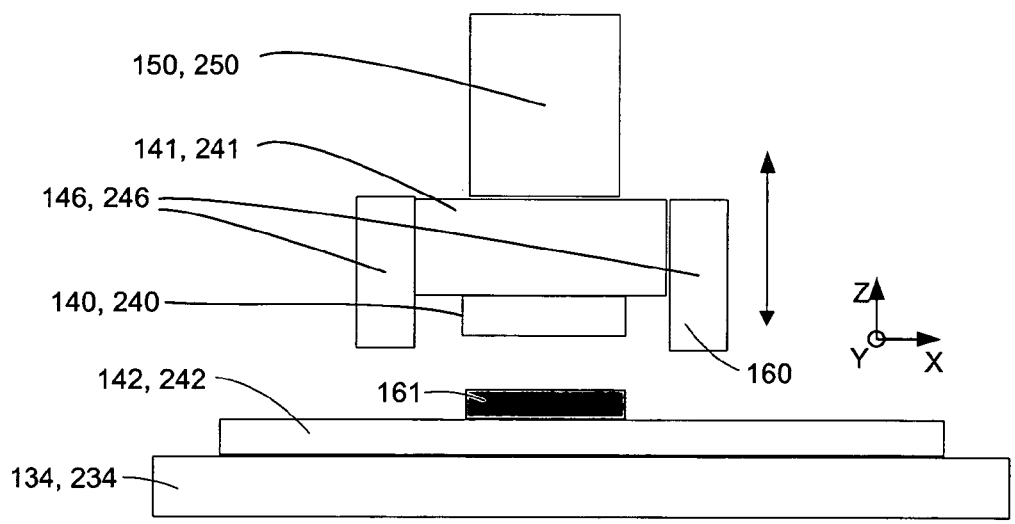

Referring to FIGS. 7 to 9, in use the substrate table 134, 234 is scanned in the X-direction beneath the imprint template 140, 240. During this scanning movement, imprintable medium is deposited onto a target portion of the substrate 142, 242 using the inkjet nozzles 160 of the left hand imprintable medium dispenser 146, 246. The supply of imprintable medium from the inkjet nozzles 160 is stopped once the target portion has been covered with imprintable medium. This is shown schematically in FIG. 9, the layer of imprintable medium being designated 161. The substrate table 134, 234 continues to move in the X-direction until the imprint template 140, 240 is located over the target portion of imprintable medium 161. The target portion of the substrate 142, 242 is thus located beneath the imprint template 140, 240 directly after it passes beneath the imprintable medium dispenser 146, 246. The imprint template 140, 240 is pressed into the imprintable medium 161, which is then illuminated using the UV source 150, 250. The imprint template 140, 240 is then removed from the imprintable medium 161, and the substrate table 134, 234 is once again scanned in the X-direction to allow further imprintable medium to be applied to the substrate 142, 242.

The term 'directly after' is intended to mean that the target portion does not pass through a significant route (e.g. scans in the positive and negative X-direction and translations in the Y-direction) before it is beneath the imprint template 140, 240. It is not intended to mean that there is no separation between the imprintable medium dispenser 146, 246 and the imprint template 140, 240.

When, at a subsequent time, the substrate table is 134, 234 is being scanned in the negative X-direction, the right hand imprintable medium dispenser 146, 246 is used to deposit imprintable medium onto the substrate 140, 240.

Referring to FIG. 7, substrates handlers (not illustrated) may be provided at either side of the apparatus, to put substrates onto the substrate tables 134 and 234, and to remove the substrates from the substrate tables. Alternatively, a single substrate handler may be used, the substrate tables 134, 234 swapping positions, as shown schematically by the arrows in the center of FIG. 7, to allow the single substrate handler to put a substrate onto and remove a substrate from both the substrate tables.

Although two UV radiation sources 150, 250 are shown, these may be replaced by a single source which is connected via suitable radiation paths to both of the imprint templates 140, 240. In one arrangement the radiation path may be configured to allow simultaneous illumination of both substrates 142, 242. Where this is done, operation of the portion of apparatus on the left hand side of FIG. 7 and the portion of apparatus of the right hand side of FIG. 7 is synchronized so that the illumination falls onto the substrates 142, 242 at the appropriate time (i.e. when the imprint templates 140, 240 are pressed onto the substrates).

In an alternative arrangement, the radiation path may be configured such that radiation may only pass to one substrate at a given time. For example this may be achieved by using a movable mirror. Where this is done, the apparatus shown in the left hand side of FIG. 7 is operated asynchronously with respect to the apparatus shown in the right hand side of FIG. 7, such that the illumination falls upon the substrate at the appropriate time. This arrangement allows a weaker UV radiation source to be used, since radiation from the source is only sent to one substrate at any given time.

Although the imprintable medium dispensers 146, 246 are shown in FIGS. 7 to 9 as being located on either X-direction side of the imprint template holder 140, 240, it will be appreciated that the imprintable medium dispensers may alternatively be located on either Y-direction side of the imprint template. The positions at which the imprintable medium dispensers 146, 246 are located may be determined by considering the direction(s) in which the substrate table 134, 234 will be moved, so that imprintable medium is provided on a given target portion of the substrate 142, 242 before that target portion is beneath the imprint template 140, 240.

In some instances it may be desired to provide the imprintable medium dispensers on each side of the imprint template holder 141, 241.

The embodiment of the invention described in relation to FIGS. 7 to 9 may provide an increased throughput because it allows imprinting of two substrates to occur simultaneously. In addition, it allows imprintable medium to be provided on the substrates just before imprinting occurs.

The imprintable medium dispensers described in relation to FIGS. 7 to 9 may be provided in an imprint lithography apparatus which includes only one substrate table.

Figure 10:
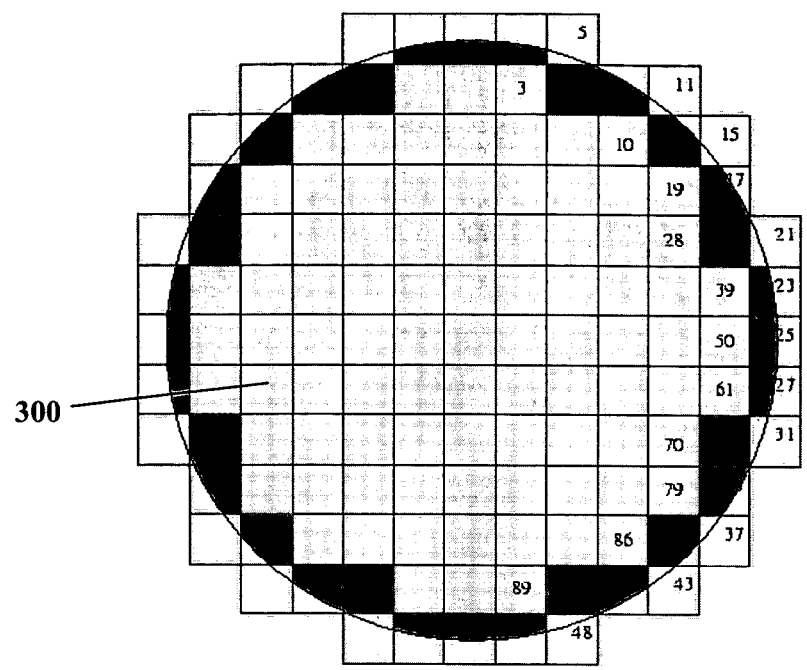
FIGS. 10 and 11 schematically show a further alternative embodiment of the invention.

An alternative embodiment of the invention is illustrated schematically in FIG. 10. A substrate 300 is divided up into an array of target portions which are indicated by a grid of lines. Target portions which fall fully within the perimeter of the substrate 300 are provided with light grey shading. There are 89 such target portions (the right hand target portion of each row is numbered). Surrounding these target portions are additional target portions which partially fall outside of the perimeter of the substrate 300. Those target portions which fall predominantly on the substrate 300 are shaded dark grey, and those target portions which fall predominantly outside of the substrate 300 are white. There are 48 target portions which do not fully fall within the perimeter of the substrate 300 (the right hand target portion of each row is numbered).

It is conventional in imprint lithography to imprint only target portions which fully fall within the perimeter of a substrate. However, in the embodiment of the invention, the target portions which fall partially outside of the substrate 300 are also imprinted. This means that the thickness of the imprintable medium is substantially constant across the entire substrate, and provides the advantage that subsequent processing of the substrate has a more consistent effect. For example, chemical and mechanical polishing of the substrate is more even due to the substantially constant thickness of the imprintable medium. This compares with the situation in which the imprintable medium is tapered at edges of the substrate, and chemical mechanical polishing of the substrate has an inconsistent effect. Providing the imprintable medium with a constant thickness across the substrate also allows a subsequent planarization layer to be more easily applied to the substrate.

Although it is possible to use a conventional imprint template to imprint target portions which partially overlap the edge of the substrate 300, it is also possible to use a simplified imprint template. A simplified imprint template may have, for example, no functional pattern, but may instead include a pattern which is arranged to have a similar duty cycle (or pattern density layout) to a functional imprint template. The resulting imprinted regions will not provide functional dies, but will fulfill the desired purpose of keeping the imprintable medium substantially level (and with a similar density) such that chemical mechanical polishing (or other processing) is better performed.

In an alternative arrangement, the imprint templates include functional dies with dimensions that are smaller than those of the target portion. For example, the imprint template used to imprint regions which partially overlap with the substrate 300 may be provided with four functional dies. Where this is done, in many instances at least one of the functional dies will fall fully onto the substrate 300 and result in the formation of a functional integrated circuit (or other device). The target portions where this is likely to happen are indicated in dark grey, whereas the target portions where this is unlikely to happen are indicated in white.

In one arrangement, all of the target portions shown in FIG. 10 may be imprinted in a single imprint step using a single imprint template which covers the entire substrate 300. Alternatively, the target portion may be imprinted individually, or may be imprinted using an array of imprint templates (for example an array equivalent to that described above in relation to FIGS. 5 and 6). The lithographic apparatus may be configured such that all of the target portions which fall within the substrate 300 are imprinted at a first location (for example the second position as described further above), and the target portions which partially overlap with the substrate may be imprinted at a different location within the lithography apparatus (for example a third position). Where this is done, the partially overlapping target portions may be imprinted in a single imprint step using a suitably arranged array of imprint templates, or maybe imprinted in a series of imprinted steps. Similarly, the target portions which fall fully within the substrate 300 may be imprinted in a single imprint step using a suitably arranged array of imprint templates or maybe imprinted in a series of imprint steps.

An alternative embodiment includes an imprint apparatus comprising one or more first templates at a first location and one or more second templates at a second location, wherein the apparatus further comprises a substrate table that is movable between the first location and the second location. In an embodiment, the first templates are used to, e.g., imprint the target portions falling entirely within the substrate area and the second templates, which may be provided with a relatively cheap dummy pattern or even be unpatterned, falling partly outside the substrate area. The apparatus may comprise more than 1, e.g. 2, substrate tables. The apparatus depicted in FIG. 7, optionally without the dispensers 146, 246, is an embodiment of an apparatus that may be used.

In some instances, a lip of imprintable material may form at an edge of the substrate 300 when the imprintable material is put onto the substrate, for example using spin-coating. Where the entire substrate 300 is imprinted within a single imprint step using an array of imprint templates, the array of imprint templates will automatically flatten out this lip of imprintable material. If, on the other hand, the edge of the imprint template is imprinted in one or more separate imprint steps, then the orientation and height of the imprint template may be controlled in order to flatten the imprintable material so that it has a thickness which is consistent across the substrate 300.

The substrate may be flatter at its center than it is at its edge. In order to correct for this, a substrate table (see, for example, FIG. 4 and FIG. 5) may be provided with an active substrate chuck which has, for example, movable support portions which may be adjusted to improve the flatness of the edge of the substrate.

Figure 11:
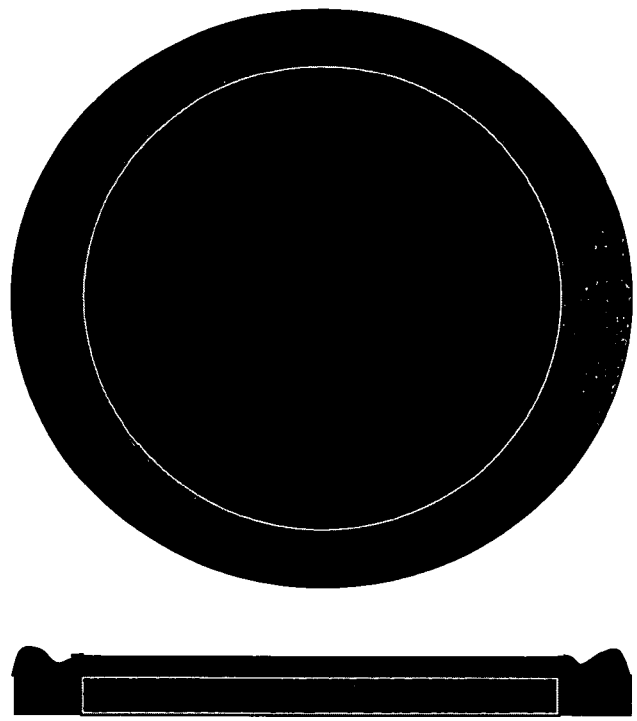

A planarization layer may be applied to the substrate using, for example, spin-coating. Where this is done, a lip may arise in the planarization layer at the edge of a substrate. This effect may be diminished by providing a perimeter (e.g., an annulus) around the substrate during the spin-coating process as shown in FIG. 11. This has the effect of moving the effective edge, which causes the lip in the planarization layer to be formed on the perimeter rather than on the substrate. The perimeter may be removed after spin-coating of the planarization layer, thereby leaving behind a substrate provided with a substantially flat planarization layer.

The perimeter is arranged to fit securely to the substrate, and is height adjustable to ensure that as far as possible the height of the upper surface of the perimeter matches the height of the upper surface of the substrate.

While specific examples of the invention have been described above, it will be appreciated that the present invention may be practiced otherwise than as described. The description is not intended to limit the invention.

The invention claimed is:

1. An imprint lithography apparatus, comprising:
   a first substrate table arranged to hold a substrate;
   a second substrate table arranged to hold a substrate;
   an imprint template holder arranged to hold an imprint template; and
   an imprintable medium dispenser,
   wherein the first substrate table is moveable between a first position located at or adjacent to the imprintable medium dispenser, and a second position located at or adjacent to the imprint template holder, and
   wherein the second substrate table is moveable between the first and second positions such that the first and second substrate tables swap positions.

2. The apparatus of claim 1, further comprising a first alignment system located at or adjacent the imprintable medium dispenser and a second alignment system located at or adjacent to the imprint template holder.

3. The apparatus of claim 2, wherein the first alignment system is arranged to determine the location of one or more alignment marks on the first substrate with respect to one or more alignment marks on the first substrate table.

4. The apparatus of claim 1, further comprising a set of interferometers arranged to monitor the locations of the substrate tables.

5. The apparatus of claim 4, comprising a first set of interferometers arranged to monitor the location of whichever substrate table is at or adjacent to the imprintable medium dispenser and a second set of interferometers arranged to monitor the location of whichever substrate table is at or adjacent to the imprint template holder.

6. The apparatus of claim 1, wherein the substrate tables are moveable in two directions which both lie in a plane substantially perpendicular to an axis of movement of the imprint template holder.

7. The apparatus of claim 1, wherein the substrate tables are each supported by a gas foot.

8. The apparatus of claim 1, wherein the imprintable medium dispenser comprises an inkjet nozzle, or an array of inkjet nozzles.

9. The apparatus of claim 1, wherein the lateral positions of the imprint template holders are adjustable.

10. The apparatus of claim 1, further comprising a third position which is at or adjacent to one or more additional imprint template holders arranged to hold one or more additional imprint templates.

11. The apparatus of claim 10, wherein the one or more additional imprint template holders are arranged to allow target portions which partially overlap an edge of the substrate to be imprinted.

12. The apparatus of claim 1, wherein the imprint template holder is configured to hold at least four imprint templates.

13. An imprint lithography apparatus, comprising:
    a first substrate table arranged to hold a substrate;
    a second substrate table;
    one or more first template holders at a first position; and
    one or more second template holders at a second position,
    wherein the first and second substrate tables are movable between the first and second positions, such that the first and second substrate tables swap positions.

14. The apparatus of claim 13, wherein the one or more first template holders are configured to hold a plurality of first templates.

15. The apparatus of claim 14, wherein the one or more second template holders are configured to hold a plurality of second templates.

16. The apparatus of claim 13, wherein the one or more first template holders are configured to hold at least four first templates.

17. The apparatus of claim 13, further comprising a plurality of imprintable medium dispensers, at least one dispenser of the plurality of imprintable medium dispensers arranged to dispense liquid at one side of one of the template holders and at least one further dispenser of the plurality of imprintable medium dispensers arranged to dispense liquid at an opposite side of the one of the template holders.

18. An imprint lithography apparatus, comprising:
    a first substrate table arranged to hold a substrate;
    one or more first template holders at a first position holding one or more first templates; and
    one or more second template holders at a second position holding one or more second templates,
    wherein the first substrate table is movable between the first and second positions, and
    wherein the one or more second templates have a coarser pattern than the one or more first templates or have no pattern.

19. The apparatus of claim 18, comprising a second substrate table arranged to hold a substrate, wherein the first and second substrate tables are moveable so as to swap positions.

20. The apparatus of claim 18, further comprising a plurality of imprintable medium dispensers, at least one dispenser of the plurality of imprintable medium dispensers arranged to dispense liquid at one side of one of the templates and at least one further dispenser of the plurality of imprintable medium dispensers arranged to dispense liquid at an opposite side of the one of the templates.

21. An imprint lithography apparatus, comprising:
    a substrate table arranged to hold a substrate;
    a template holder configured to hold an imprint template; and
    a plurality of imprintable medium dispensers, at least one dispenser of the plurality of imprintable medium dispensers arranged to dispense liquid at one side of the template and at least one further dispenser of the plurality of imprintable medium dispensers arranged to dispense liquid at an opposite side of the template.

22. The apparatus of claim 21, wherein template holder is configured to hold a plurality of imprint templates.

23. The apparatus of claim 22, wherein template holder is configured to hold at least four imprint templates.

24. The apparatus of claim 22, comprising at least one dispenser of the plurality of imprintable medium dispensers arranged to dispense liquid at one side of each template of the plurality of templates and at least one further dispenser of the plurality of imprintable medium dispensers arranged to dispense liquid at an opposite side of said each template of the plurality of templates.

25. The apparatus of claim 21, comprising a plurality of imprintable medium dispensers arranged to dispense liquid at one side of the template and a plurality of imprintable medium dispensers arranged to dispense liquid at an opposite side of the template.

26. The apparatus of claim 21, comprising a further substrate table arranged to hold a substrate, wherein the substrate tables are moveable so as to swap positions.

* * * * *